United States Patent
Huang

[11] Patent Number: 5,837,579
[45] Date of Patent: Nov. 17, 1998

[54] RUGGED POLYSILICON PROCESS FOR DRAM CAPACITORS

[75] Inventor: Heng-Sheng Huang, Taipei, Taiwan

[73] Assignee: United Microelectronics Corporation, Taiwan

[21] Appl. No.: 806,830

[22] Filed: Feb. 26, 1997

Related U.S. Application Data

[60] Provisional application No. 60/024,270 Aug. 21, 1996.
[51] Int. Cl.$^6$ .................................................. H01L 28/8242
[52] U.S. Cl. ........................... 438/255; 438/254; 438/964
[58] Field of Search ..................................... 438/253, 254, 438/255, 396, 397, 398, 665, 964

[56] References Cited

U.S. PATENT DOCUMENTS

| | | | |
|---|---|---|---|
| 5,049,517 | 9/1991 | Liu et al. | 438/254 |
| 5,278,091 | 1/1994 | Fazan et al. | 438/964 |
| 5,597,754 | 1/1997 | Lou et al. | 438/255 |
| 5,618,747 | 4/1997 | Lou | 438/255 |

*Primary Examiner*—Chandra Chaudhari
*Attorney, Agent, or Firm*—Rabin & Champagne, P.C.

[57] ABSTRACT

A stacked capacitor DRAM is formed on a substrate having a pass transistor and a wiring line covered by a layer of insulator. A self-aligned contact process is used to expose the surface of one of the source/drain regions of the pass transistor and three layer stack is deposited over the layer of insulator. The lowest, first layer is polysilicon in contact with the one source/drain region of the pass transistor, the second layer is silicon oxide, and the third, topmost layer of the stack is either silicon nitride or polysilicon. A mask is formed over the third layer to laterally define the capacitor structure and then the third and second layers are etched down to the surface of the first, polysilicon layer. Differential etching is then performed to laterally etch the second layer without etching the first or third layers. The mask is removed and hemispherical grained silicon (HSG-Si) is grown over all of the exposed surfaces of the device. The first layer is then etched using conventional photolithography to finish defining the lateral extent of the lower capacitor electrode, then a capacitor dielectric layer and an upper capacitor electrode are provided.

19 Claims, 3 Drawing Sheets

5,837,579

RUGGED POLYSILICON PROCESS FOR DRAM CAPACITORS

This application claims priority from provisional application Ser. No. 60/024,270, filed Aug. 21, 1996.

BACKGROUND OF THE INVENTION

1. Field of the Invention

The present invention relates to the formation of capacitor structures within semiconductor devices and, more particularly, to the formation of capacitor devices that store charge within dynamic random access memory (DRAM) devices.

2. Description of the Related Art

Further reductions in the size of memory cells within dynamic random access memory (DRAM) devices, and corresponding increases in the storage density of DRAMs, present a variety of challenges related to the reduced dimensions of the structures within the memory cell and in the increased processing difficulty associated with making such small structures. The typical DRAM memory cell consists of a charge storage capacitor electrically connected to the drain of a "pass" MOS transistor. The pass transistor acts as a switch for selectively coupling the charge storage capacitor to the memory cell's signal lines during data read out or write processes to discharge or charge the capacitor. As DRAM memory cells are made smaller, efforts are made to reduce the size of the pass transistor and the capacitor, while maintaining the capacitance of the capacitor to keep constant the amount of charge stored in the memory cell.

A difficulty that arises with making dynamic random access memories (DRAMs) in accordance with smaller design rules is that the charge storage capacitors of the DRAM are made too small to retain an acceptable level of charge. Too small of charge storage capacitors can make the reading of data from the DRAM cell undesirably difficult, can make the data stored within the DRAM cell undesirably vulnerable to noise or leakage, and can require too frequent of data refresh operations. There is, therefore, a continuing need to develop charge storage capacitors for DRAMs which provide a larger level of capacitance but which take up the same or a smaller amount of substrate area. One strategy for making higher capacitance charge storage capacitors is to provide stacked and finned capacitor structures so that additional capacitor surface area is provided by adding vertical superstructure to the capacitor.

Conventional methods of forming stacked and finned capacitor structures, however, are undesirably complex. For example, many such processes require multiple high accuracy alignment steps to form a vertically extending capacitor fin.

SUMMARY OF THE PREFERRED EMBODIMENTS

It is accordingly an object of the present invention to provide a more manufacturable method of forming a DRAM capacitor structure.

An aspect of the invention provides a method of making a memory device including a charge storage capacitor on a substrate on which a transistor is provided having source/drain regions formed on the substrate and a gate electrode formed above the surface of the substrate. A first insulating layer is deposited over the transistor and an opening is provided through the first insulating layer to expose a first source/drain region of the transistor. A first layer of conductive material is deposited over the first insulating layer to be electrically coupled to the first source/drain region of the transistor. A second layer of a second material different from the conductive material is deposited over the first layer of conductive material and a third layer of a third material different form the second material is deposited over the second layer of the second material. The third and second layers are etched to laterally define a portion of a capacitor electrode. The method continues by laterally etching the second layer of the second material using an etching process that selectively etches the second material at a faster rate than either the first or third material is etched during the etching process. The first layer is etched to further laterally define the portion of the capacitor electrode. A layer of silicon is deposited on the third layer, on a remaining surface of the second layer and on the first layer. A dielectric layer is formed over the portion of the capacitor electrode and a fourth layer of a conductive material is formed over the dielectric layer, thereby providing an upper capacitor electrode.

Another aspect of the invention provides a method of making a memory device including a charge storage capacitor on a substrate on which a transistor is provided having source/drain regions formed on the substrate and a gate electrode formed above the surface of the substrate. A first insulating layer is deposited over the transistor and an opening is provided through the first insulating layer to expose a first source/drain region of the transistor. A first layer of polysilicon is deposited over the first insulating layer and on the first source/drain region of the transistor. A layer of silicon oxide is deposited over the first layer of polysilicon and a third layer of a third material is deposited over the silicon oxide, the third material being chosen from the materials including silicon nitride and polysilicon. The third and second layers are anisotropically etched to laterally define a portion of a capacitor electrode. The second layer of silicon oxide is laterally etched using an etching process that selectively etches silicon oxide at a faster rate than either polysilicon or the third material is etched during the etching process. The first layer is etched to further laterally define the capacitor electrode. A layer of silicon is deposited on the third layer, on a remaining surface of the second layer and on the first layer. A dielectric layer is deposited over the portion of the capacitor electrode and a fourth layer of polysilicon is formed over the dielectric layer, providing an upper capacitor electrode.

DETAILED DESCRIPTION OF THE PREFERRED EMBODIMENTS

Preferred embodiments of the present invention provide a method of making a DRAM charge storage capacitor that provides a high level of capacitance using a process that is simpler than the manufacturing processes conventionally used to achieve these levels of capacitance. Particularly preferred embodiments of the present invention form a stacked capacitor electrode having rugged polysilicon formed over upper and lower surfaces of a capacitor superstructure having laterally extending fins. Such a structure may be formed on a substrate having a pass transistor and a wiring line covered by a layer of insulator. A self-aligned contact process is used to expose the surface of one of the source/drain regions of the pass transistor. A three layer stack is deposited over the layer of insulator with the lowest, first layer preferably comprising polysilicon in contact with the one source/drain region of the pass transistor. The second layer of the stack is different from both the first polysilicon layer and the third, topmost layer of the stack. A mask is formed over the third layer to laterally define the capacitor structure and then the third and second layers are etched down to the surface of the first, polysilicon layer. Differential etching is then performed to laterally etch the second layer without etching the first or third layers. The mask is removed and, in preferred embodiments, "rugged" or hemispherical grained silicon (HSG-Si) is grown over all of the exposed surfaces of the device. The first layer is then etched using conventional photolithography to finish defining the lateral extent of the lower capacitor electrode, then a capacitor dielectric layer and an upper capacitor electrode are provided.

Figure 1:
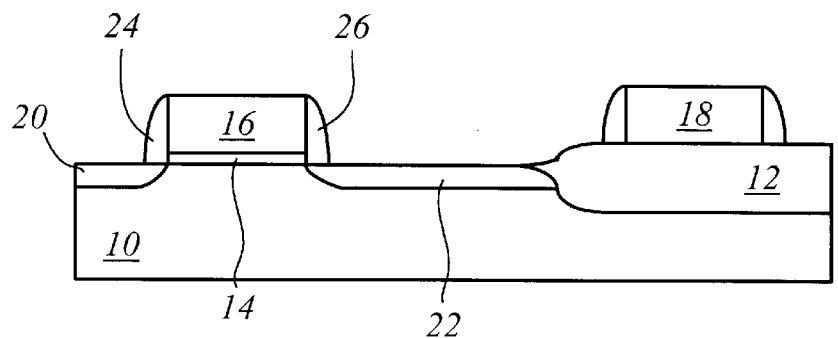
FIGS. 1–7 illustrate a DRAM charge storage capacitor and a method for making a DRAM charge storage capacitor in accordance with preferred embodiments of the present invention.

Further aspects of the present invention are now described in greater detail with reference to the figures. FIG. 1 shows in partial cross-section a portion of a DRAM cell at an intermediate stage of processing. A DRAM pass or transfer transistor is formed on the left of the illustrated cell and a charge storage capacitor will be formed in contact with one of the source/drain regions of the cell's pass transistor. A field isolation region 12 of, for example silicon oxide, is formed by a LOCOS or other device isolation process on the surface of a P-type silicon substrate 10. A gate oxide layer 14 is formed over the substrate to a thickness of between about 40–200 Å by a high temperature oxidation process or by CVD. A layer of polysilicon is deposited over the surface of the substrate 10 and on the gate oxide layer 14 by low pressure chemical vapor deposition (LPCVD) at a temperature of approximately 600–650° C. to a thickness of between about 2000–4000 Å. The layer of polysilicon is doped, preferably N-type, either during deposition or by ion implantation followed by an anneal. If a multi-layer gate electrode such as a metal silicide/polysilicon or a silicon oxide/polysilicon layered structure is to be used as the gate electrode of the DRAM transistor, then the multi-layer gate electrode is preferably formed at this time.

The gate electrodes and wiring lines are then patterned by forming a photoresist or other mask and then etching to form a polysilicon gate electrode 16 and a polysilicon wiring line 18. Source/drain contacts 20, 22 are then formed. In preferred embodiments, a lightly doped portion of a lightly doped drain (LDD) structure is formed in source/drain regions 20, 22 by implanting, for example, arsenic or phosphorus ions to form moderately doped N-type regions in the substrate. Insulating sidewall spacer structures 24, 26 are then provided alongside the gate electrode 16 and the wiring line 20. The spacers 24, 26 may be formed from silicon oxide or silicon nitride by blanket depositing a layer of the appropriate material over the device and then etching back the layer to form the spacers. A second implantation is then performed to complete the LDD structure of the source/drain regions 20, 22, forming heavily doped regions in the source/drain regions self-aligned to the spacers 24, 26 on either side of the gate electrode 16 of the cell transistor. In other embodiments, particularly those made in accordance with very small dimension design rules, an LDD structure may be used for the drain region only with the source region having a uniform doping or uniform, moderate doping levels might be used in both the source and the drain of the pass transistor. This structure is illustrated in FIG. 1. In the illustrated memory cell, as is the case in many conventional DRAMs, one of the source/drain regions (20) serves as a bit line for coupling together several pass transistors, while the other of the source/drain regions 22 will act as a contact for the charge storage capacitor. Gate electrode 16 functions as a word line in this DRAM.

Figure 2:
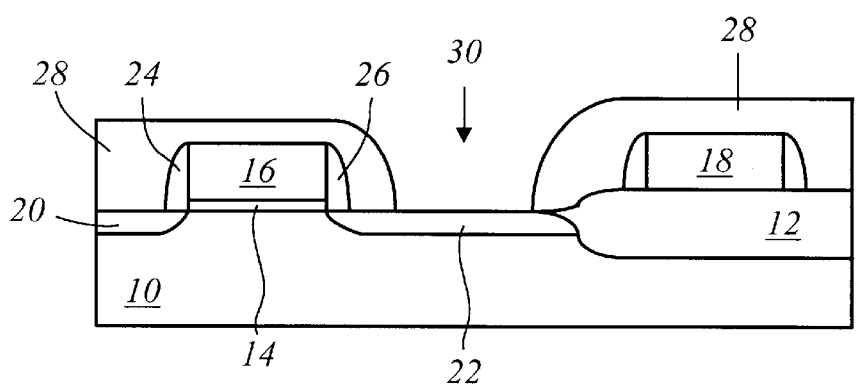

After the source and drain regions are formed for the pass transistor, a layer 28 of an insulator such as silicon oxide is deposited over the device, for example by a plasma enhanced chemical vapor deposition (PEVCD) process using a tetra-ethyl-ortho-silicate (TEOS) source gas. Other insulators and other deposition methods might be used for the insulating layer 28. A sufficiently thick oxide layer is desirably left over the surface of both the gate electrode 16 and the wiring line 18 to protect those structures during subsequent processing. To this end, it is desirable for the silicon oxide layer 28 to be deposited to a thickness of between about 1000–2500 Å. Next, a self-aligned contact process is used to expose and clean the source/drain region 22 on which the charge storage capacitor is to be formed, producing the structure illustrated in FIG. 2 with the via 30 exposing the surface of the source/drain region 22.

Figure 3:
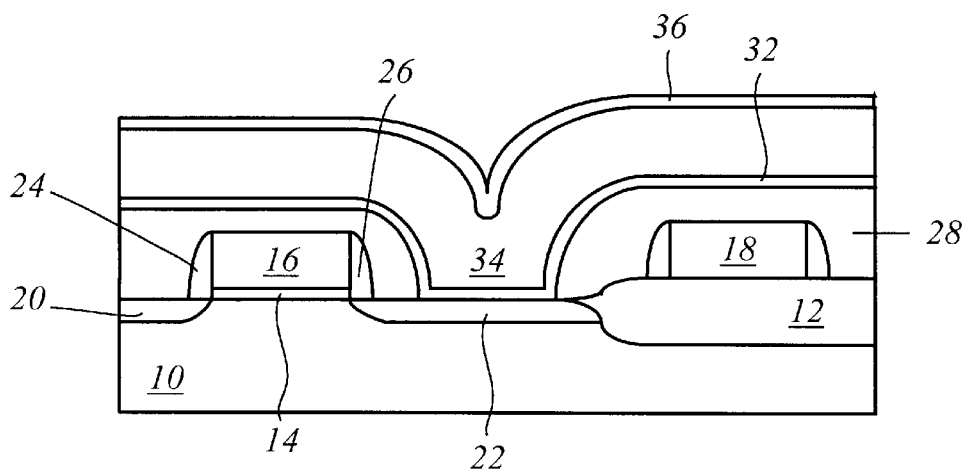

A layer of polysilicon 32 is deposited by LPCVD at a temperature of approximately 600–650° C. to a thickness of approximately 500 Å over the surface of the silicon oxide layer 28 and extending along the walls of the via 30 and in contact with the source/drain region 22. The layer of polysilicon 32 is preferably doped N-type either during deposition by addition of arsine to the deposition gases or by ion implantation of, for example, arsenic ions at a preferred energy of between about 30 KeV to 100 KeV, to a dose of about $1 \times 10^{16}$ atoms/cm$^2$. Polysilicon is preferred for the layer 32 because this layer electrically connects with the source/drain region 22. Next, a layer of silicon oxide 34 is deposited, for example, by atmospheric pressure chemical vapor deposition (APCVD), LPCVD or PECVD using tetra-ethyl-ortho-silicate (TEOS) as a source gas. Layer 34 may be deposited to a thickness of approximately 3000 Å. After deposition, the TEOS oxide layer 34 is preferably subjected to a thermal process to density the TEOS oxide in a manner which provides stabler structures and better control of subsequent etch processes. Deification of the TEOS oxide is accomplished at a temperature of approximately 1000° C. for a time period of between 10–30 minutes, with the TEOS oxide layer 34 shrinking by approximately 6% during densification. It is possible to substitute other insulating layers or other materials for silicon oxide layer 34, as long as the materials are different from polysilicon layer 32, but silicon oxide is a preferred material because of the greater variety of choices available for etching and the comparatively lower levels of stress that is exerted on the substrate through use of the silicon oxide layer. The use of silicon oxide for layer 34 reinforces the preference for the use of polysilicon for the lowest layer 32 of the stack, because silicon oxide can readily etched without affecting a polysilicon layer. After the silicon oxide layer 34 is formed, a third layer 36 is added to the stack shown in FIG. 3. The third layer 36 may be approximately 500 Å thick and may consist of either silicon nitride deposited by CVD or polysilicon. Most preferably, the stack's third layer 36 is different in composition from the silicon oxide layer 34. If the third layer 36 comprises polysilicon, it is preferred that the polysilicon be doped with a POCl$_3$ diffusion to provide lower internal resistance for the capacitor structure to be formed.

Figure 4:
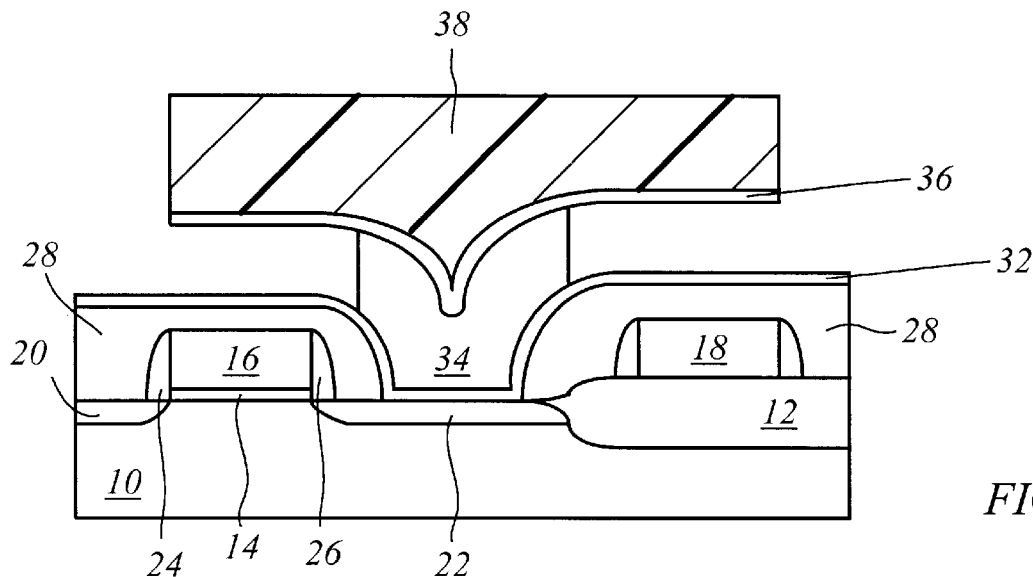

After the stack of layers 36, 34 and 32 is formed, lateral definition of the fins of the capacitor structure is begun by forming a photoresist mask 38 (FIG. 4) on the third layer 36, with the mask 38 covering the portions of layer 36 that are to be left in place. Typically, the width of the mask is determined by the spacing between adjacent capacitor structures, with the mask being designed to leave approximately 0.4 μm, or less when using more aggressive design rules, between adjacent completed capacitor electrodes. If layer 36 comprises silicon nitride, then layer 36 is anisotropically etched using an etchant gas mixture such as a mixture of $SF_6$, He and $O_2$. A well-suited etching environment for etching the silicon nitride of layer 36, as well as other anisotropic etching processes used in this method, is the P5000 etcher manufactured by Applied Materials Corporation, although similar etching systems can also be used. If instead layer 36 comprises polysilicon, the polysilicon may be etched using a plasma etchant derived from chlorine gas and a bromine-containing gas such as HBr. It is possible to remove the photoresist mask 38 at this point in the process, using the stack's third layer 36 as a mask for further etching. Often, however, it is preferred that the photoresist mask 38 be left in place to protect the relatively thin surface layer 36.

Next, the silicon oxide layer 34 is etched. Although it would be possible to use an isotropic etch for the first part of the silicon oxide etch process and for the continued etching of the silicon oxide layer 34 performed in preferred embodiments of this invention, it is preferred that the first part of the silicon oxide etch be performed anisotropically. Use of a directional oxide etch is preferred because it better ensures a more uniform width of the silicon oxide support formed in the etching process and therefore a more structurally sound capacitor structure. The first part of the etching of silicon oxide layer 34 may be accomplished, for example, by a plasma etchant derived from a gas mixture consisting of $CHF_3$, $O_2$ and Ar. This first part of the silicon oxide etch is preferably continued to expose the surface of the polysilicon layer 32. Next, an isotropic etch process is used to laterally etch the silicon oxide layer 34, undercutting the remaining portion of the third layer 36. An appropriate etch may consist of wet etching in a dilute HF solution, since HF has a high level of selectivity with respect to both the surface layer 36 (either polysilicon or silicon nitride) and the polysilicon layer 32. The polysilicon layer 32 serves to protect underlying oxide layers during the etching of the silicon oxide layer 34, broadening the number of different etchants that are available for the etching process. The duration of the lateral etch of the silicon oxide layer 34 is determined by the strength of the third layer 36 and the amount of the silicon oxide layer 34 that must remain to support the portion of the capacitor formed on the silicon oxide layer 34. It should be noted that the finished capacitor structure is sturdier than the intermediate processing steps illustrated herein.

Figure 5:
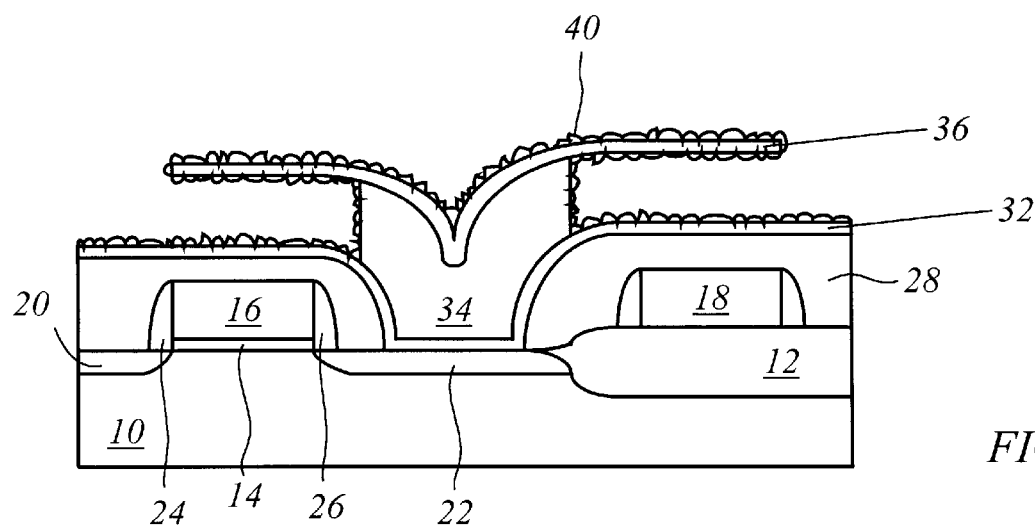

After the silicon oxide layer 34 is laterally etched, the photoresist mask is removed, if it has not been previously removed. Next, a layer of rugged polysilicon or hemispherical grained silicon (HSG-Si) 40 is formed over the exposed surfaces of the incomplete DRAM structure. Use of HSG-Si is preferred over the deposition of either amorphous silicon or polysilicon, since the roughness of the HSG-Si film produces a surface area that is greater than either conventional polysilicon or amorphous silicon. A variety of techniques have been used to produce textured polysilicon for use in semiconductor devices such as DRAMs. Preferred embodiments of the invention utilize an HSG-Si layer deposited by LPCVD using a silane source gas onto a substrate held at a temperature of between 570° C. to 585° C. The resulting structure is shown in FIG. 5, and includes an irregular surface of HSG-Si on the first polysilicon layer 32, on the vertical surfaces of the silicon oxide layer 34, and on the underside and top of the third layer 36. Typically, the HSG-Si will have a surface roughness determined by the crystallite size of about 80 nanometers. The HSG-Si layer may be doped in situ during deposition by including phosphine in the deposition gases or the HSG-Si layer 40 may be doped by diffusion from $POCl_3$. Ion implantation would typically not be effective for doping the HSG-Si layer 40 under the third layer 36 and so is not a preferred doping method for this step.

Figure 6:
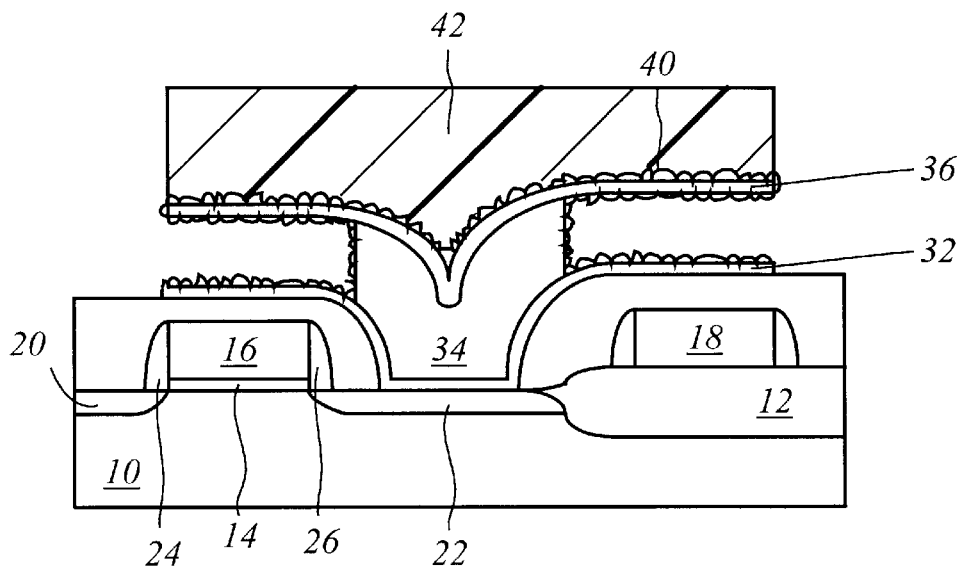
Figure 7:
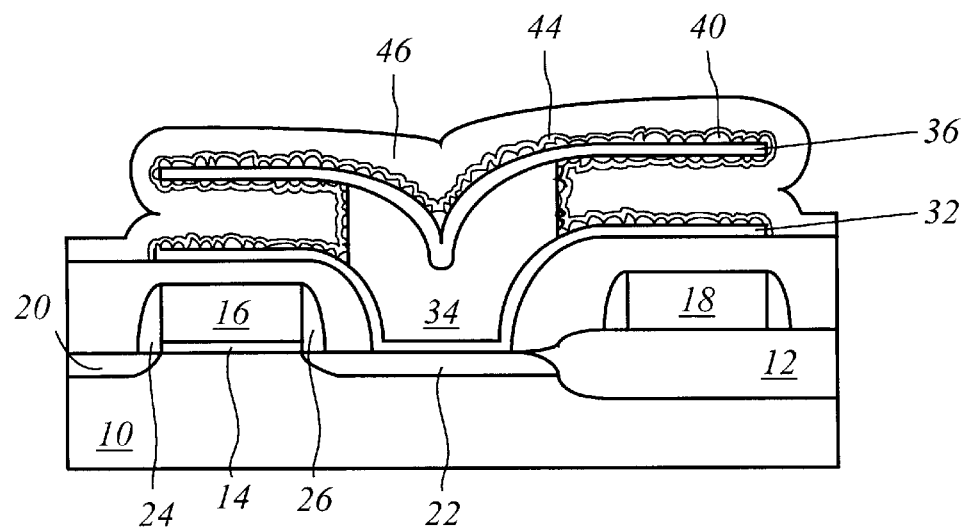

Another photoresist mask 42 is then formed over the capacitor electrode structure (FIG. 6), and the first polysilicon layer 32, covered by the HSG-Si layer 40, is etched to complete the lateral definition of the capacitor electrode, again using a plasma etchant derived from chlorine gas and a bromine-containing gas such as HBr. The mask is then removed. Processing continues by forming a dielectric layer 44 on the exposed polysilicon surfaces of the charge storage capacitor's bottom electrode, shown in FIG. 7, to a thickness of 30–150 Å. Desirably, the dielectric material has a high dielectric constant and can be made thin without pinholes and without regions of locally poor quality material. An appropriate dielectric layer can be formed by depositing a layer of silicon nitride, for example by CVD, and then growing a thin oxide layer on the surface of the silicon nitride layer. Often, this "NO" layer is formed on top of an oxide layer, such as a native oxide layer covering the surface of the polysilicon lower electrode, so that the actual dielectric film formed has an "ONO" structure. Alternatively, the native oxide on the surface of the bottom electrode can be removed by dipping the device in a dilute HF solution. Then the dielectric layer formed has an "NO" structure. Finally, a polysilicon layer 42 is deposited by LPCVD over the device (FIG. 7), and then the polysilicon layer 40 is doped by ion implantation and patterned to form an upper electrode for the capacitor. Further conventional processing is performed to complete the DRAM device.

The present invention has been described in terms of certain preferred embodiments. The invention is not, however, limited to the specific embodiments described, but also includes such modifications and variations as fall within the scope of the following claims.

What is claimed:

1. A method of making a memory device on a substrate, the memory device including a charge storage capacitor, the method comprising the steps of:

providing a transistor having source/drain regions formed on a surface of the substrate, and having a gate electrode formed above the surface of the substrate;

providing a first insulating layer over the transistor;

providing an opening through the first insulating layer to expose a first source/drain region of the transistor;

depositing a first layer of conductive material over the first insulating layer, the first layer of conductive material electrically coupled to the first source/drain region of the transistor;

depositing a second layer of a second material different from the conductive material over the first layer of conductive material;

depositing a third layer of a third material over the second layer of the second material, the third material different form the second material;

etching the third and second layers to laterally define a portion of a capacitor electrode;

laterally etching the second layer of the second material using an etching process that selectively etches the second material at a faster rate than either the first or third material is etched during the etching process;

etching the first layer to further laterally define the portion of the capacitor electrode;

depositing a layer of silicon on the third layer, on a remaining surface of the second layer and on the first layer;

forming a dielectric layer over the portion of the capacitor electrode; and forming a fourth layer of a conductive material over the dielectric layer, thereby providing an upper capacitor electrode.

2. The method of claim 1, wherein the layer of silicon is hemispherical grained silicon.

3. The method of claim 2, wherein the first layer of conductive material is doped polysilicon.

4. The method of claim 3, wherein the first layer of conductive material is deposited on the surface of the first source/drain region.

5. The method of claim 3, wherein the second material is silicon oxide and wherein the third material is chosen from the group consisting of silicon nitride and polysilicon.

6. The method of claim 3, wherein the second material is silicon oxide and the step of laterally etching the second layer comprises an etch in a dilute HF solution.

7. The method of claim 6, wherein the third material is doped polysilicon.

8. The method of claim 1, wherein the second material is deposited from a TEOS source and is subjected to a densification process.

9. The method of claim 8, wherein the second material is deposited to a thickness of at least 3000 Å.

10. The method of claim 9, wherein the first and the third layers are each about 500 Å thick.

11. The method of claim 3, wherein the layer of hemispherical grained silicon is deposited by LPCVD at a substrate temperature of less than 600° C.

12. The method of claim 3, wherein the layer of hemispherical grained silicon is doped by diffusion.

13. A method of making a memory device on a substrate, the memory device including a charge storage capacitor, the method comprising the steps of:

providing a transistor having source/drain regions formed on a surface of the substrate, and having a gate electrode formed above the surface of the substrate;

providing a first insulating layer over the transistor;

providing an opening through the first insulating layer to expose a first source/drain region of the transistor;

depositing a first layer of polysilicon over the first insulating layer, the first layer of polysilicon deposited on the first source/drain region of the transistor;

depositing a second layer of silicon oxide over the first layer of polysilicon;

depositing a third layer of a third material over the second layer of silicon oxide, the third material being chosen from the materials including silicon nitride and polysilicon;

anisotropically etching the third and second layers to laterally define a portion of a capacitor electrode;

laterally etching the second layer of silicon oxide using an etching process that selectively etches silicon oxide at a faster rate than either polysilicon or the third material is etched during the etching process;

etching the first layer to further laterally define the capacitor electrode;

depositing a layer of silicon on the third layer, on a remaining surface of the second layer and on the first layer;

forming a dielectric layer over the portion of the capacitor electrode; and forming a fourth layer of polysilicon over the dielectric layer, thereby providing an upper capacitor electrode.

14. The method of claim 13, wherein the layer of silicon is hemispherical grained silicon.

15. The method of claim 13, wherein the step of laterally etching the second layer comprises an etch in a dilute HF solution.

16. The method of claim 13, wherein the third material is doped polysilicon.

17. The method of claim 1, wherein the silicon oxide is deposited from a TEOS source and is subjected to a densification process.

18. The method of claim 17, wherein the second material is deposited to a thickness of at least 3000 Å.

19. The method of claim 13, wherein the layer of hemispherical grained silicon is deposited by LPCVD at a substrate temperature of less than 600° C.

* * * * *